United States Patent
Miki

(10) Patent No.: US 10,340,200 B2
(45) Date of Patent: Jul. 2, 2019

(54) SEMICONDUCTOR DEVICE

(71) Applicant: SHINKO ELECTRIC INDUSTRIES CO., LTD., Nagano-shi, Nagano (JP)

(72) Inventor: Shota Miki, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/825,622

(22) Filed: Nov. 29, 2017

(65) Prior Publication Data

US 2018/0174939 A1   Jun. 21, 2018

(30) Foreign Application Priority Data

Dec. 20, 2016 (JP) .................................. 2016-246555

(51) Int. Cl.
  *H01L 23/34* (2006.01)
  *H01L 23/50* (2006.01)
  *H01L 23/29* (2006.01)
  *H01L 23/367* (2006.01)

(52) U.S. Cl.
  CPC ............ *H01L 23/34* (2013.01); *H01L 23/293* (2013.01); *H01L 23/50* (2013.01); *H01L 23/367* (2013.01); *H01L 2224/16145* (2013.01)

(58) Field of Classification Search
  CPC ........ H01L 23/34; H01L 23/50; H01L 23/293
  See application file for complete search history.

(56) References Cited

U.S. PATENT DOCUMENTS

| | | | | |
|---|---|---|---|---|
| 2012/0088332 A1* | 4/2012 | Lee | ........................ | H01L 21/561 438/113 |
| 2013/0082399 A1* | 4/2013 | Kim | ........................ | H01L 24/19 257/774 |
| 2013/0264720 A1* | 10/2013 | Chun | ..................... | H01L 23/481 257/774 |
| 2015/0102468 A1* | 4/2015 | Kang | ..................... | H01L 24/97 257/621 |
| 2015/0162265 A1* | 6/2015 | Jo | ........................... | H01L 24/97 257/774 |

(Continued)

FOREIGN PATENT DOCUMENTS

| | | |
|---|---|---|
| JP | 2012-004432 | 1/2012 |
| JP | 2015-225933 | 12/2015 |
| JP | 2016-076722 | 5/2016 |

*Primary Examiner* — Douglas M Menz
(74) *Attorney, Agent, or Firm* — Rankin, Hill & Clark LLP

(57) ABSTRACT

A semiconductor device includes: a first semiconductor chip including an electrode pad on one surface of the first semiconductor chip; a multilayer chip stack that is disposed on the one surface of the first semiconductor chip to be connected to the electrode pad; a columnar spacer that is disposed on the one surface of the first semiconductor chip; and an underfill resin. The multilayer chip stack includes a plurality of second semiconductor chips each of which comprises a connection terminal. The connection terminal of one of the second semiconductor chips is directly connected to the electrode pad. Another one of the second semiconductor chips is mounted on the one of the second semiconductor chips. A gap between the first semiconductor chip and the one of the second semiconductor chips and a gap between adjacent ones of the second semiconductor chips are filled with the underfill resin.

6 Claims, 21 Drawing Sheets

(56) References Cited

U.S. PATENT DOCUMENTS

2016/0079184 A1\* 3/2016 Tsukiyama ............. H01L 24/16
  257/737
2016/0079222 A1\* 3/2016 Sato ....................... H01L 25/18
  257/738

\* cited by examiner (PARTIAL ENLARGED SECTIONAL VIEW)

SEMICONDUCTOR DEVICE

SEMICONDUCTOR DEVICE

This application claims priority from Japanese Patent Application No. 2016-246555, filed on Dec. 20, 2016, the entire contents of which are herein incorporated by reference.

BACKGROUND

1. Technical Field

The present disclosure relates to a semiconductor device.

2. Background Art

According to the background art, there are multilayer semiconductor devices in each of which a plurality of semiconductor chips are layered on top of one another. In such a semiconductor device, layered semiconductor chips are connected to one another via through electrodes formed in the respective semiconductor chips (see e.g., JP-A-2012-4432, JP-A-2015-225933, and JP-A-2016-76722).

In a manufacturing method for a multilayer semiconductor device as will be described in an undermentioned preliminary matter, memory chips are reflow-soldered one by one in each chip region of a semiconductor device wafer to thereby form a multilayer chip stack. Then, after the multilayer chip stack is sealed with a mold resin, the semiconductor device wafer and the mold resin are cut so that individual semiconductor devices can be obtained.

In the semiconductor device according to the preliminary matter, there is a problem that a total mounting time for the memory chips is considerably long to thereby result in poor production efficiency. In addition, there is a fear that heat radiation cannot be obtained satisfactorily because sides of the multilayer chip stack are sealed with the mold resin.

SUMMARY

According to one or more aspects of the present disclosure, there is provided a semiconductor device.

The semiconductor device comprises:

a first semiconductor chip comprising an electrode pad on one surface of the first semiconductor chip;

a multilayer chip stack that is disposed on the one surface of the first semiconductor chip to be connected to the electrode pad;

a columnar spacer that is disposed on the one surface of the first semiconductor chip (5a); and an underfill resin.

The multilayer chip stack comprises a plurality of second semiconductor chips each of which comprises a connection terminal.

The connection terminal of one of the second semiconductor chips is directly connected to the electrode pad.

Another one of the second semiconductor chips is mounted on the one of the second semiconductor chips.

A gap between the first semiconductor chip and the one of the second semiconductor chips and a gap between adjacent ones of the second semiconductor chips are filled with the underfill resin.

DETAILED DESCRIPTION

An embodiment will be described below with reference to the accompanying drawings.

A preliminary matter underlying the embodiment will be described prior to description of the embodiment. Description of the preliminary matter is about the details of personal study of the present inventor, which contain novel techniques rather than known techniques.

FIGS. 1A to 1C and FIGS. 2 to 7 are views for explaining a manufacturing method for a semiconductor device according to the preliminary matter.

Figure 1A:
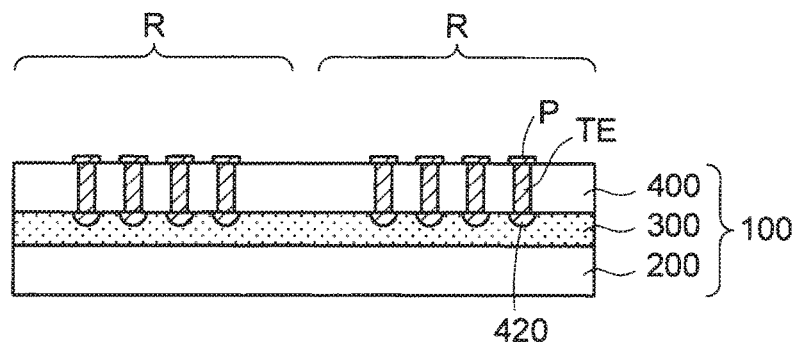
FIGS. 1A to 1C are sectional views (Part 1) showing a manufacturing method for a semiconductor device according to a preliminary matter.

First, a semiconductor member 100 shown in FIG. 1A is prepared. In the semiconductor member 100, a semiconductor device wafer 400 is disposed on a support member 200 through an adhesive layer 300. Through electrodes TE are formed in the semiconductor device wafer 400 to penetrate the semiconductor device wafer 400 in a thickness direction thereof.

Electrode pads P are formed on upper surfaces of the through electrodes TE formed in the semiconductor device wafer 400. Connection terminals 420 are formed on lower surfaces of the through electrodes TE. Transistors, wirings, etc. are formed on a lower surface of the semiconductor device wafer 400 to thereby build an electric circuit. The electric circuit is electrically connected to the through electrodes TE.

A plurality of chip regions R which will be later divided into individual semiconductor chips are defined in the semiconductor device wafer 400. Two of the chip regions R are partially shown in FIG. 1A.

The semiconductor device wafer 400 is bonded to the support member 200 by the adhesive layer 300 in a state in which the connection terminals 420 are embedded in the adhesive layer 300.

Figure 1B:
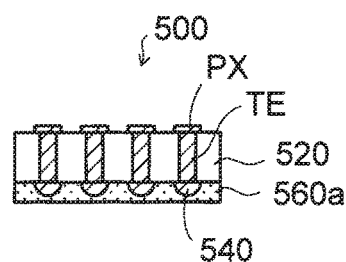

Next, a memory chip 500 is prepared, as shown in FIG. 1B. In the memory chip 500, through electrodes TE are formed in a silicon substrate 520 in which a storage element is formed. Electrode pads PX are formed on upper surfaces of the through electrodes TE. Connection terminals 540 are formed on lower surfaces of the through electrodes TE.

Further, the memory chip 500 is provided with an uncured resin layer 560a in its lower surface. The connection terminals 540 are embedded in the resin layer 560a.

Figure 1C:
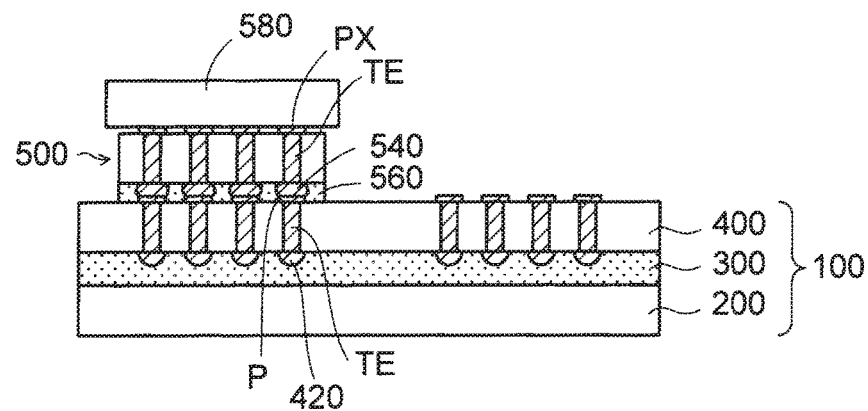

Successively, as shown in FIG. 1C, a bonding tool 580 for chip mounting is prepared, and a back surface of the memory chip 500 is adsorbed by the bonding tool 580.

Further, the connection terminals 540 of the memory chip 500 adsorbed by the bonding tool 580 are pressed onto the electrode pads P of the semiconductor device wafer 400 so as to be brought into contact therewith.

In this state, the memory chip 500 is heated by a heating unit of the bonding tool 580. Thus, solders of the connection terminals 540 of the memory chip 500 are bonded to the electrode pads P of the semiconductor device wafer 400.

On this occasion, the uncured resin layer 560a in the lower surface of the memory chip 500 is cured simultaneously by the heat applied to the memory chip 500. Thus, an underfill resin 560 is formed between the semiconductor device wafer 400 and the memory chip 500.

Further, by the same method, connection terminals 540 of another memory chip 500 are bonded onto the electrode pads PX of the mounted memory chip 500 by the bonding tool 580.

Figure 2:
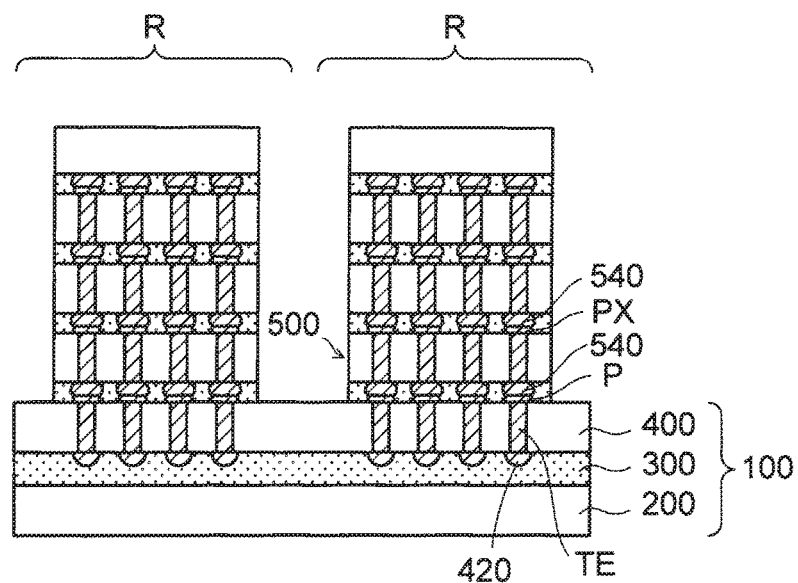
FIG. 2 is a sectional view (Part 2) showing the manufacturing method for the semiconductor device according to the preliminary matter.

When such mounting of a memory chip 500 is repeated, four memory chips 500 are first layered on top of one another in one chip region R of the semiconductor device wafer 400, as shown in FIG. 2.

Next, by the same method, four memory chips 500 are layered on top of one another in another chip region R of the semiconductor device wafer 400. In this manner, four memory chips 500 are layered on top of one another in each of a large number of the chip regions R of the semiconductor device wafer 400.

Since the method is to heat the memory chips 500 one by one to thereby solder-bond the memory chips 500 to one another in each of the chip regions R of the semiconductor device wafer 400, a first problem of the semiconductor device according to the preliminary matter is that it takes a long time to mount one memory chip 500.

For example, one memory chip 500 is reflow-soldered as follows. That is, the memory chip 500 is preheated at 150° C. and for 30 seconds, and then mainly heated at peak temperature set at 230° C. to 260° C. and for 10 seconds.

Moreover, since a considerable number of memory chips 500 are mounted one by one, a considerable time in total is required.

Figure 3:
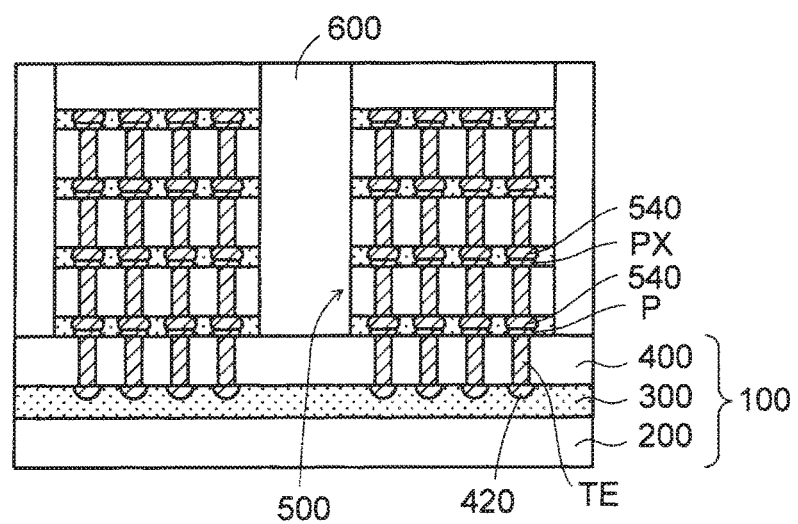
FIG. 3 is a sectional view (Part 3) showing the manufacturing method for the semiconductor device according to the preliminary matter.

Next, as shown in FIG. 3, side surfaces of multilayer stacks of the memory chips 500 are sealed with a mold resin 600 so that back surfaces of the uppermost memory chips 500 can be exposed.

Figure 4:
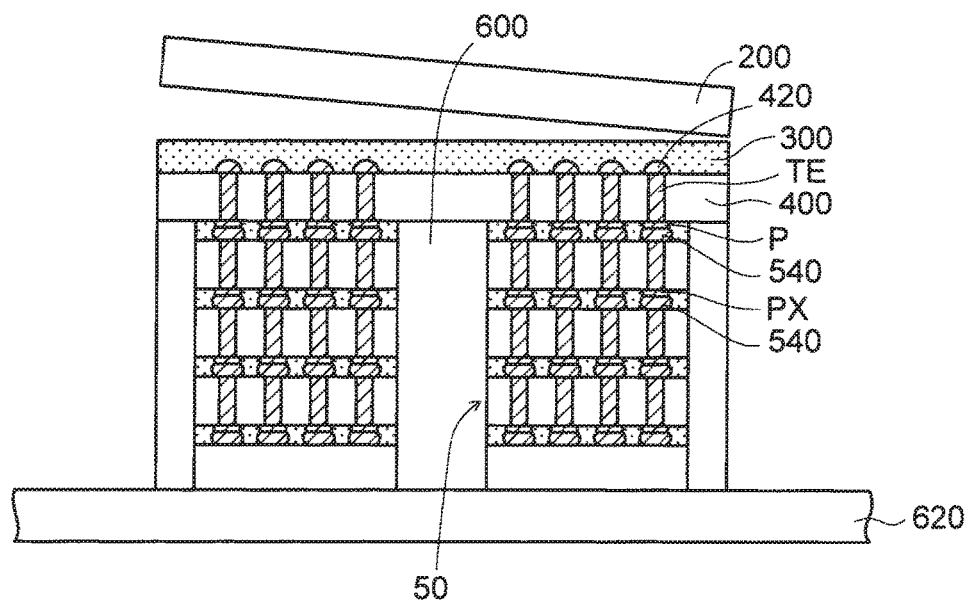
FIG. 4 is a sectional view (Part 4) showing the manufacturing method for the semiconductor device according to the preliminary matter.
Figure 5:
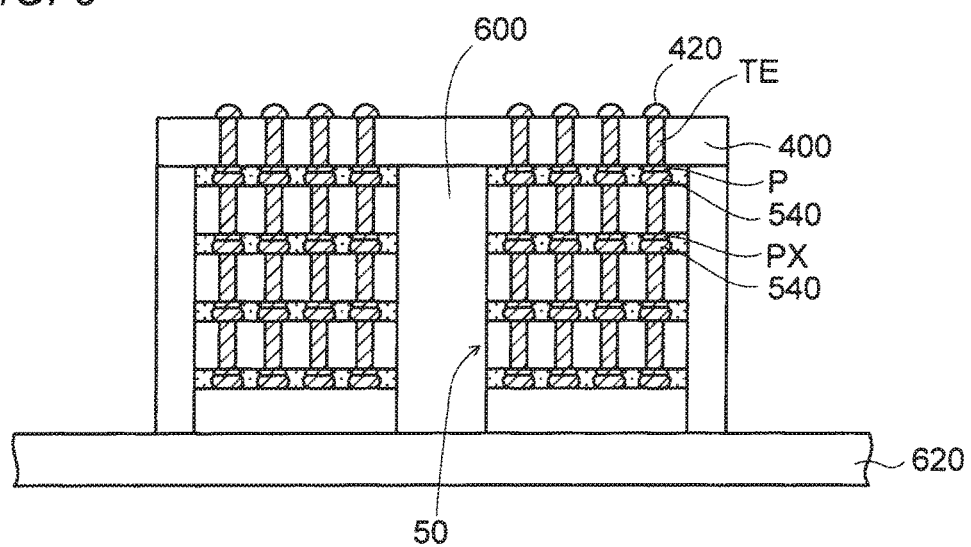
FIG. 5 is a sectional view (Part 5) showing the manufacturing method for the semiconductor device according to the preliminary matter.

As shown in FIG. 4, a structure body of FIG. 3 is inverted vertically, and the back surfaces of the uppermost memory chips 500 in FIG. 3 are disposed on a dicing tape 620. Further, the support member 200 is separated from the adhesive layer 300. Then, the adhesive layer 300 is separated from the semiconductor device wafer 400, as shown in FIG. 5. Thus, the connection terminals 420 of the semiconductor device wafer 400 are exposed on an upper surface side.

Figure 6:
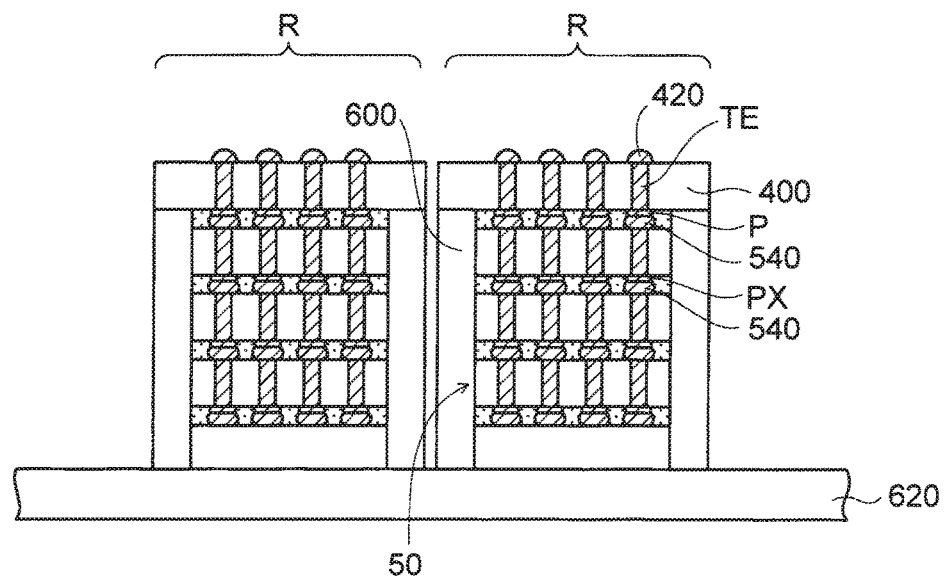
FIG. 6 is a sectional view (Part 6) showing the manufacturing method for the semiconductor device according to the preliminary matter.

As shown in FIG. 6, the semiconductor device wafer 400 and the mold resin 600 are cut so that the respective chip regions R of the semiconductor device wafer 400 can be obtained. Further, individual structure bodies in FIG. 6 are inverted vertically, as shown in FIG. 7.

Thus, individual semiconductor chips 410 can be obtained from the semiconductor device wafer 400, and multilayer semiconductor devices in each of which four memory chips 500 are layered on a corresponding semiconductor chip 410 can be obtained.

Figure 7:
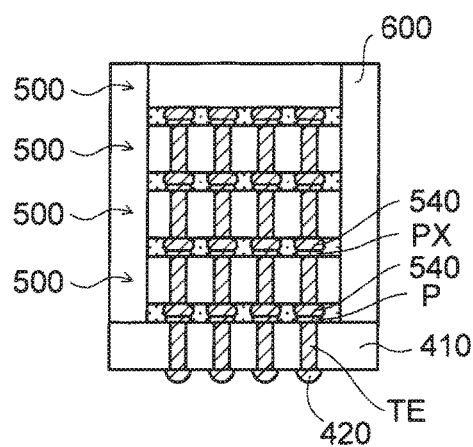
FIG. 7 is a sectional view showing the semiconductor device according to the preliminary matter.

Sides of the semiconductor chip 410 and the memory chips 500 are sealed with the mold resin 600 low in heat conductivity in each of the semiconductor devices in FIG. 7. For this reason, a second problem of the semiconductor device according to the preliminary matter is that heat radiation cannot be obtained satisfactorily and there is therefore a concern about reliability.

As described above, the semiconductor device according to the preliminary matter has a problem that it takes a long processing time to layer and mount the memory chips to thereby result in poor production efficiency, and heat radiation cannot be obtained satisfactorily.

The aforementioned disadvantages can be solved by a semiconductor device and a manufacturing method for the semiconductor device according to an embodiment which will be described below.

Embodiment

Figure 29:
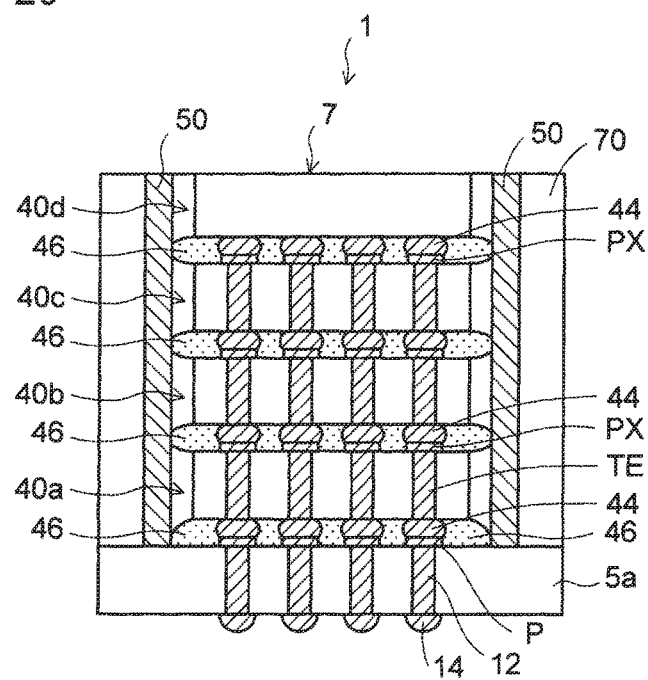
FIG. 29 is a sectional view showing the semiconductor device according to the embodiment.
Figure 30:
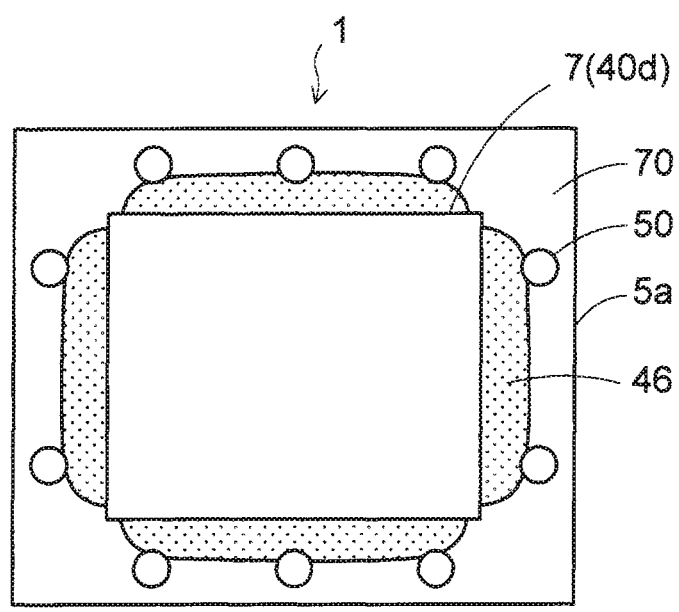
FIG. 30 is a plan view showing the semiconductor device according to the embodiment.

FIGS. 8 to 28 are views for explaining the manufacturing method for the semiconductor device according to the embodiment. FIG. 29 and FIG. 30 are views showing the semiconductor device according to the embodiment. The structure of the semiconductor device will be described below while the manufacturing method for the semiconductor device is described.

Figure 8:
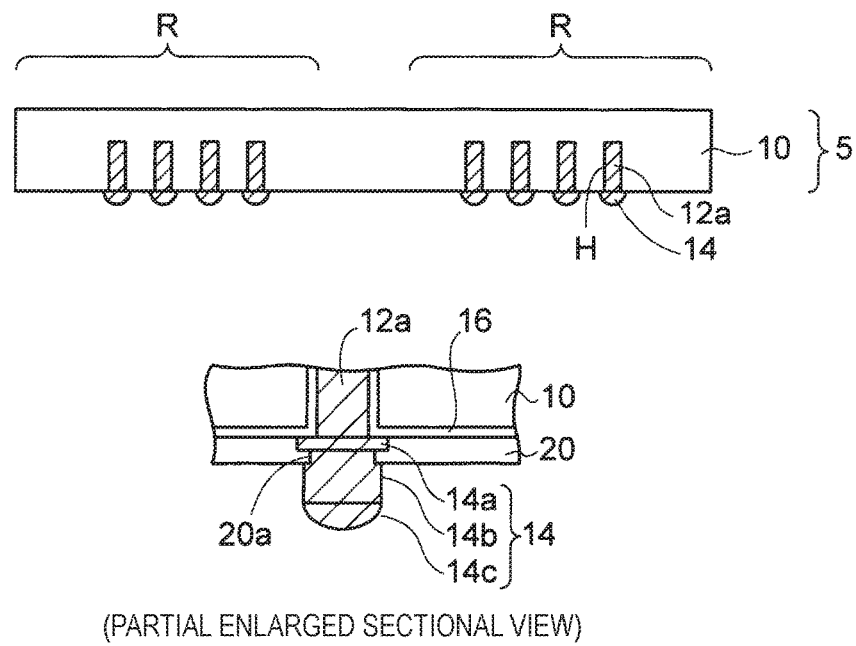
FIG. 8 is a sectional view (Part 1) showing a manufacturing method for a semiconductor device according to an embodiment.

According to the manufacturing method for the semiconductor device according to the embodiment, first, a semiconductor device wafer 5 shown in FIG. 8 is prepared. The semiconductor device wafer 5 is provided with a semiconductor substrate 10. A silicon wafer is preferably used as the semiconductor substrate 10. Holes H are formed in the semiconductor substrate 10 to extend from a lower surface side thereof to the middle of a thickness thereof. The holes H are filled with columnar electrodes 12a. Connection terminals 14 are formed on lower surfaces of the columnar electrodes 12a.

Description will be made in detail with reference to a partial enlarged sectional view in FIG. 8. An insulating layer 16 is formed to extend along inner surfaces of the holes H from the lower surface of the semiconductor substrate 10. The columnar electrodes 12a are insulated from the semiconductor substrate 10 by the insulating layer 16.

In addition, aluminum (Al) pads 14a are formed on the lower surfaces of the columnar electrodes 12a. Further, a protective insulating layer 20 having opening portions 20a exposing the Al pads 14a is formed on the lower surface of the semiconductor substrate 10.

In addition, copper (Cu) bumps 14b are formed on lower sides of the Al pads 14a. Solders 14c are formed on lower sides of the Cu bumps 14b.

Each of the connection terminals 14 is built from the Al pad 14a, the Cu bump 14b and the solder 14c.

Transistors, wirings, etc. are formed on the lower surface of the semiconductor substrate 10 to thereby build an electric circuit. The electric circuit is electrically connected to the columnar electrodes 12a through the Al pads 14a.

A plurality of chip legions R which will be later divided into individual semiconductor chips are defined in the semiconductor device wafer 5. Two of the chip regions R are partially shown in FIG. 8. The thickness of the semiconductor substrate 10 of the semiconductor device wafer 5 is, for example, about 775 µm.

Figure 9:
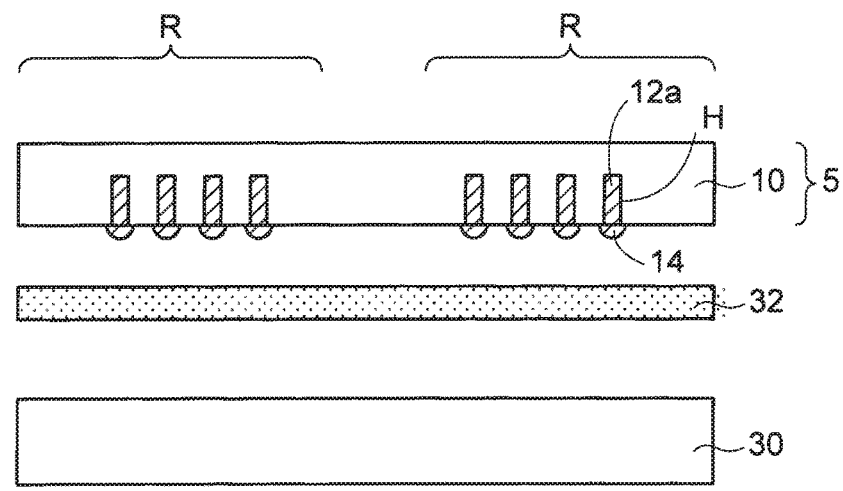
FIG. 9 is a sectional view (Part 2) showing the manufacturing method for the semiconductor device according to the embodiment.

Next, a support member 30 and an adhesive layer 32 are prepared, as shown in FIG. 9. A silicon substrate or a glass substrate etc. having a size corresponding to the semiconductor device wafer 5 is used as the support member 30. In addition, an uncured adhesive film or an adhesive tape etc. whose bonding force can be weakened by ultraviolet (UV) radiation is used as the adhesive layer 32. The semiconductor device wafer 5 is disposed on the support member 30 through the adhesive layer 32.

Figure 10:
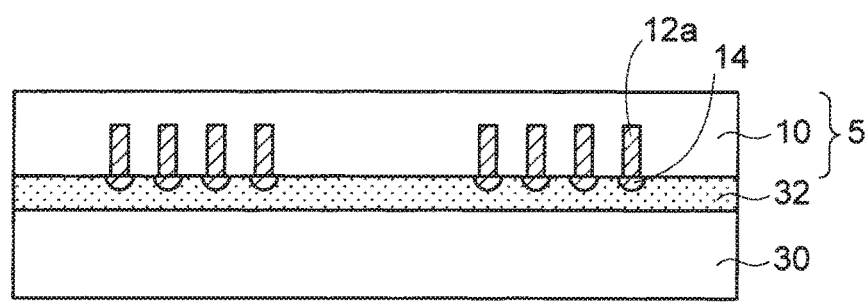
FIG. 10 is a sectional view (Part 3) showing the manufacturing method for the semiconductor device according to the embodiment.

Further, in a state in which the connection terminals 14 of the semiconductor device wafer 5 are pressed onto the adhesive layer 32 so as to be embedded therein, the semiconductor device wafer 5 is bonded to the support member 30 by the adhesive layer 32, as shown in FIG. 10.

Figure 11:
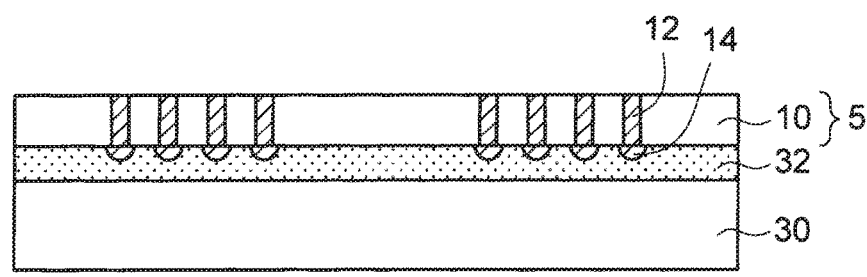
FIG. 11 is a sectional view (Part 4) showing the manufacturing method for the semiconductor device according to the embodiment.

Next, a back surface of the semiconductor substrate 10 of the semiconductor device wafer 5 is polished by CMP (Chemical Mechanical Polishing) etc. until upper surfaces of the columnar electrodes 12a are exposed, as shown in FIG. 11. Thus, the upper surfaces of the columnar electrodes 12a are exposed. The columnar electrodes 12a serve as through electrodes 12 which penetrate the semiconductor substrate 10 in a thickness direction thereof. In addition, the thickness of the semiconductor substrate 10 is reduced to be, for example, about 50 µm.

Figure 12A:
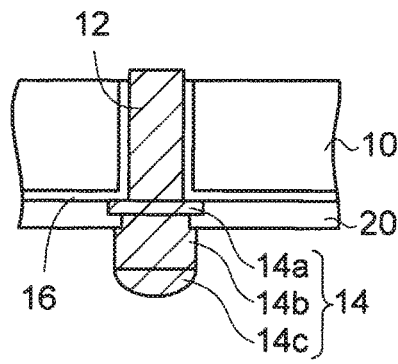
FIGS. 12A to 12D are sectional views (Part 5) showing the manufacturing method for the semiconductor device according to the embodiment.

FIG. 12A is a partial enlarged view in which a region of one of the through electrodes 12 in FIG. 11 is enlarged. As shown in FIG. 12A, upper ends of the through electrodes 12 protrude a little upward from the polished surface of the semiconductor substrate 10 in the state of FIG. 11.

Figure 12B:
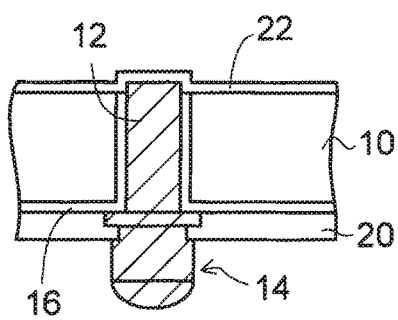
Figure 12C:
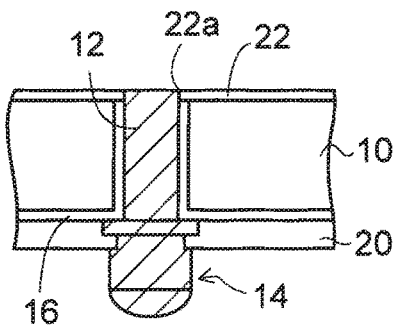

Next, as shown in FIG. 12B, an insulating layer 22 is formed on the back surface of the semiconductor substrate 10 by a CVD (Chemical Vapor Deposition) method etc. Then, as shown in FIG. 12C, opening portions 22a are formed in the insulating layer 22 by photolithography and etching so as to expose the upper surfaces of the through electrodes 12.

Figure 12D:
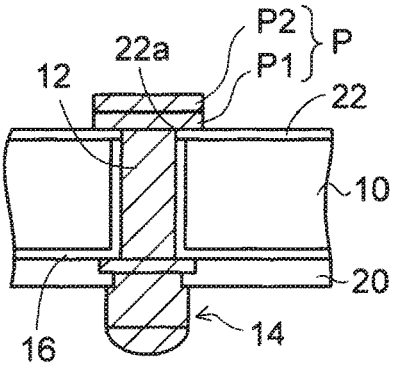

Further, as shown in FIG. 12D, a nickel (Ni) layer P1 and a gold (Au) layer P2 are formed on the upper surfaces of the through electrodes 12 sequentially from bottom to top by electroless plating to thereby obtain electrode pads P. In this manner, the electrode pads P connected to the through electrodes 12 are disposed on the back surface of the semiconductor substrate 10.

Figure 13A:
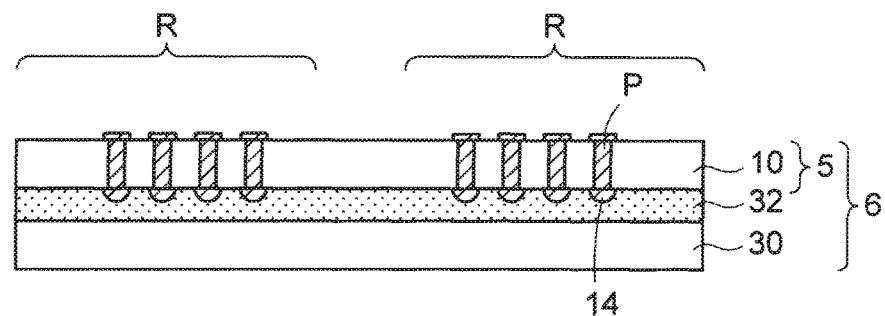
FIGS. 13A and 13B are a sectional view and a plan view (Part 6) showing the manufacturing method for the semiconductor device according to the embodiment.

In the aforementioned manner, a semiconductor member 6 in which the semiconductor device wafer 5 is disposed on the support member 30 through the adhesive layer 32 can be obtained, as shown in FIG. 13A. In the semiconductor device wafer 5, the through electrodes 12 are formed to penetrate the semiconductor substrate 10 in the thickness direction thereof, the connection terminals 14 are connected to the lower surfaces of the through electrodes 12, and the electrode pads P are connected to the upper surfaces of the through electrodes 12.

In a state in which the connection terminals 14 of the semiconductor device wafer 5 are embedded in the adhesive layer 32, the semiconductor device wafer 5 is bonded to the support member 30 through the adhesive layer 32.

Figure 13B:
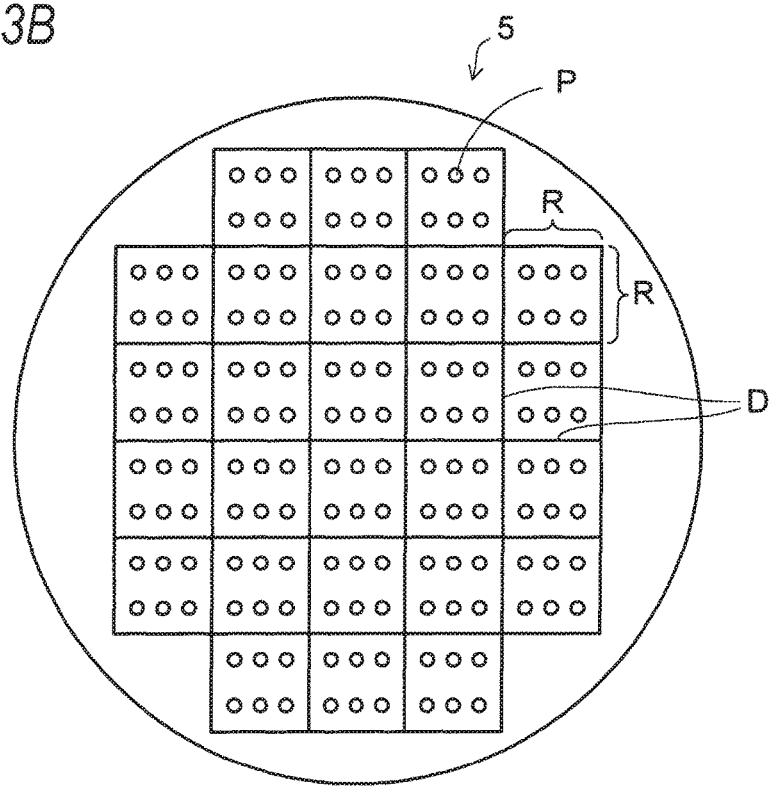

As shown in a reduced plan view of FIG. 13B, the semiconductor device wafer 5 is sectioned into a plurality of chip regions R by dicing lines D. A sectional view of FIG. 13A corresponds to a section of two of the chip regions R of the semiconductor member 6 in FIG. 13B.

Figure 14A:
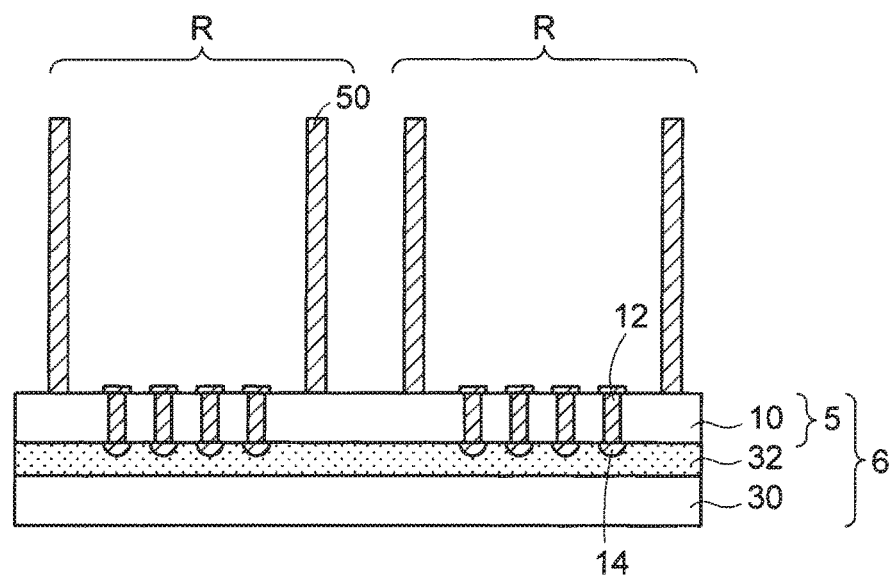
FIGS. 14A and 14B are a sectional view and a plan view (Part 7) showing the manufacturing method for the semiconductor device according to the embodiment.

Next, as shown in FIG. 14A, columnar spacers 50 are formed in a circumferential edge portion of each of the chip regions R of the semiconductor device wafer 5 in FIGS. 13A and 13B.

Figure 14B:
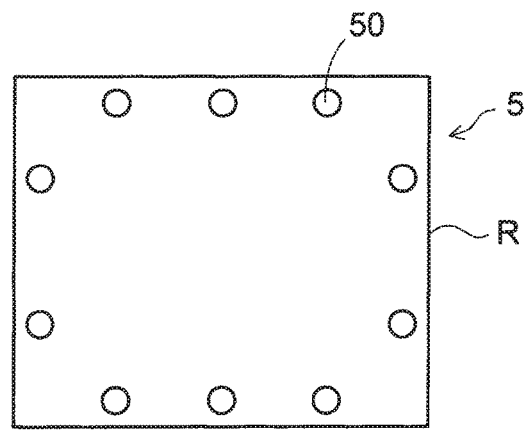

FIG. 14B is a plan view in which one of the chip regions R in FIG. 14A is seen planarly. As shown in FIG. 14B, the columnar spacers 50 are disposed to surround a central portion of the quadrilateral chip region R of the semiconductor device wafer 5. The number or arrangement of the columnar spacers 50 can be set desirably.

In addition, in the example of FIG. 14B, the shape of each of the columnar spacers 50 is formed into a circular shape in plan view. However, various shapes such as an ellipse, a square and a rectangle can be used. A plate-like column may be used.

As will be described later, in the embodiment, memory chips are layered on top of one another in each of the chip regions R of the semiconductor device wafer 5 to thereby form a multilayer chip stack, and then, the memory chips are heated in a state in which the multilayer chip stacks are pressed by a heating tool simultaneously. On this occasion, each of the columnar spacers 50 functions as a stopper for determining a height position of the heating tool in order to press the multilayer chip stacks of the chip regions R in the semiconductor device wafer 5 with uniform pressure.

In addition, as will be described later, each of the multilayer chip stacks is formed so that a resin layer (underfill resin) with which a gap between adjacent ones of the chips is filled can finally make contact with the columnar spacers 50. The columnar spacers 50 are used as heat radiators.

Therefore, the columnar spacers 50 are made of metal such as copper high in heat conductivity. When high heat radiation is not required, the columnar spacers 50 may be made of an insulating material such as a resin.

The diameter of each of the columnar spacers 50 is, for example, 200 μm to 300 μm. The height of the columnar spacer 50 is adjusted to be a little lower than the entire thickness of the multilayer chip stack which will be described later. For example, the height of the columnar spacer 50 is set at 400 μm to 500 μm.

Next, forming methods for the columnar spacers 50 when the columnar spacers 50 are made of metal will be described.

Figure 15A:
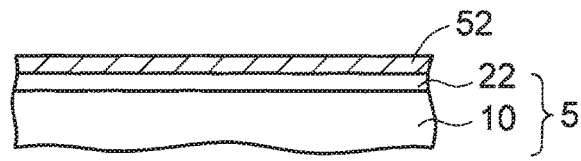
FIGS. 15A to 15C are sectional views (Part 8) showing the manufacturing method for the semiconductor device according to the embodiment.
Figure 15B:
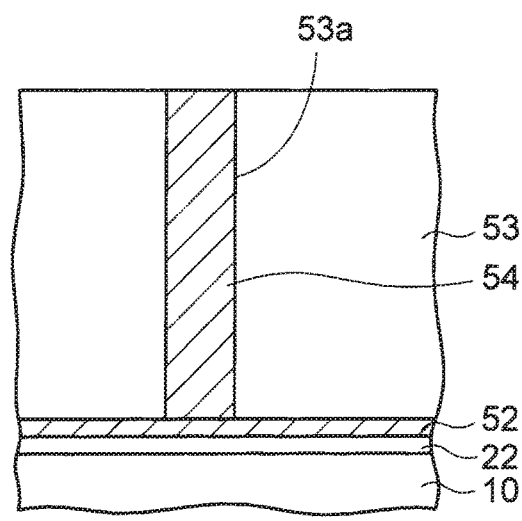
Figure 15C:
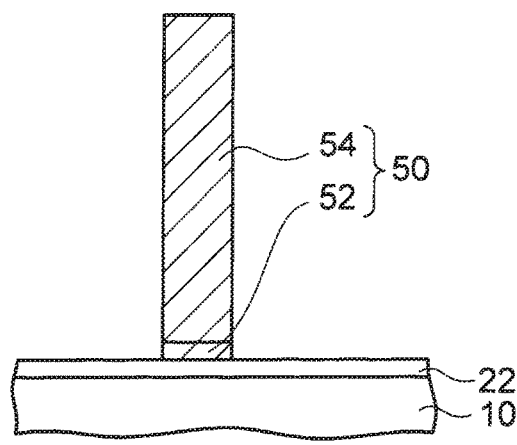

A first forming method for the columnar spacers is shown in FIGS. 15A to 15C. According to the first forming method for the columnar spacers, first, a seed layer 52 made of copper is formed on the insulating layer 22 on a back surface of the semiconductor device wafer 5, as shown in FIG. 15A.

Next, as shown in FIG. 15B, a plating resist layer 53 having opening portions 53a corresponding to the diameters of the columnar spacers is formed by photolithography.

Successively, as shown in FIG. 15B, copper posts 54 are formed in the opening portions 53a of the plating resist layer 53 by electrolytic plating using the seed layer 52 as a power feed path for the plating. Further, after the plating resist layer 53 has been removed, the seed layer 52 is removed by etching with the copper posts 54 as a mask, as shown in FIG. 15C.

Thus, each of the columnar spacers 50 is formed by the seed layer 52 and the copper post 54.

Figure 16A:
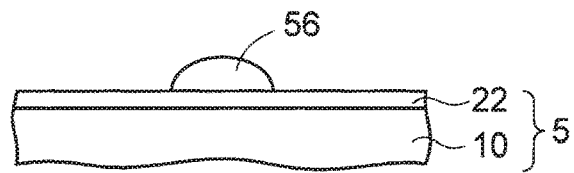
FIGS. 16A to 16C are sectional views (Part 9) showing the manufacturing method for the semiconductor device according to the embodiment.

A second forming method for the columnar spacers is shown in FIGS. 1.6A to 16C. According to the second forming method for the columnar spacers, first, silver pastes 56 are formed on the insulating layer 22 on the back surface of the semiconductor device wafer 5, as shown in FIG. 16A.

Figure 16B:
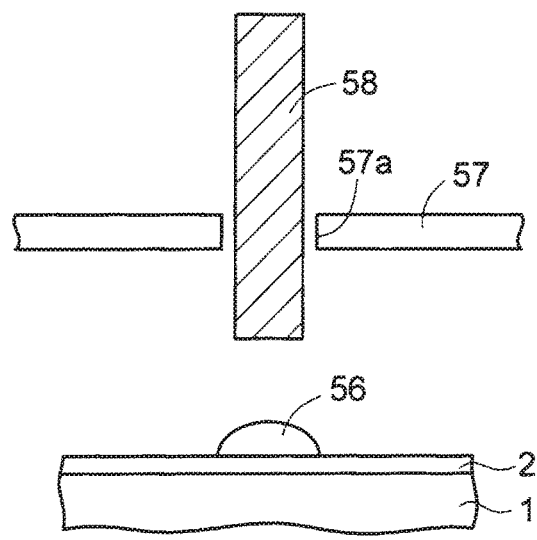

Next, as shown in FIG. 16B, an inserting jig 57 having opening portions 57a which are disposed correspondingly to the arrangement of the columnar spacers 50 is prepared. A large number of copper pins 58 are disposed on the inserting jig 57. The copper pins 58 are inserted through the opening portions 57a of the inserting jig 57 to be disposed on the silver pastes 56 respectively. Further, the silver pastes 56 are heated and cured at a temperature of 80° C. to 100° C.

Figure 16C:
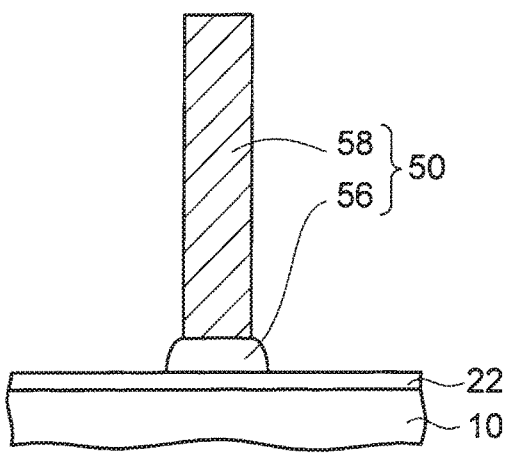

Thus, as shown in FIG. 16C, each of the columnar spacers 50 is formed by the silver paste 56 and the copper pin 58.

In addition, as another forming method for the columnar spacers, metal pads may be formed at places where the columnar spacers 50 on the insulating layer 22 on the back surface of the semiconductor device wafer 5 should be disposed, and copper pins may be fixed on the metal pads by soldering.

Figure 17A:
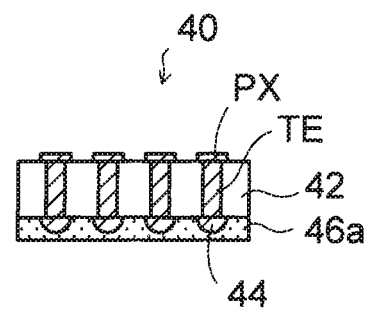
FIGS. 17A and 17B are sectional views (Part 10) showing the manufacturing method for the semiconductor device according to the embodiment.

Successively, a memory chip 40 is prepared, as shown in FIG. 17A. In the memory chip 40, through electrodes TE are formed in a silicon substrate 42 where a storage element is formed, electrode pads PX are connected to upper surfaces of the through electrode TE, and connection terminals 44 are connected to lower surfaces of the through electrodes TE.

Further, the memory chip 40 is provided with an uncured resin layer 46a in its lower surface, and the connection terminals 44 are embedded in the resin layer 46a. For example, an epoxy resin can be used as the uncured resin layer 46a.

When the height of each of the connection terminals 44 of the memory chip 40 is 20 μm, the thickness of the resin layer 46a is set at 40 μm to 50 μm.

The connection terminals 44 of the memory chip 40 are disposed correspondingly to arrangement of the electrode pads P in one of the chip regions R of the semiconductor device wafer 5. The memory chip 40 is an example of a semiconductor chip. Various LSI chips can be used as the memory chip 40.

Figure 17B:
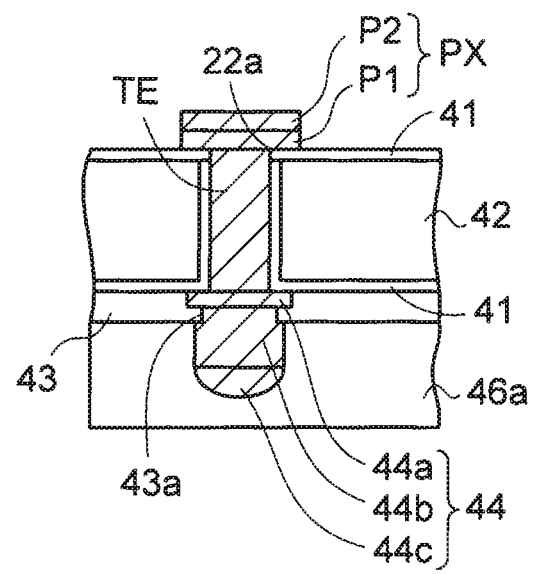

FIG. 17B is a partial enlarged view in which a region of one of the through electrodes TE in FIG. 17A is enlarged. As shown in FIG. 17B, an insulating layer 41 is formed on opposite surfaces of the silicon substrate 42 and outer circumferential surfaces of the through electrodes TE. Aluminum (Al) pads 44a are formed on lower surfaces of the through electrodes TE. A protective insulating layer 43 provided with opening portions 43a exposing the Al pads 44a is provided on the lower surface of the silicon substrate 42.

Further, copper bumps 44b and solders 44c are formed on lower sides of the Al pads 44a. As a result, connection terminals 44 are built.

In addition, the electrode pads PX formed on the upper surfaces of the through electrodes TE are formed from a nickel (Ni) layer P1 and a gold (Au) layer P2 sequentially from bottom to top.

Figure 18:
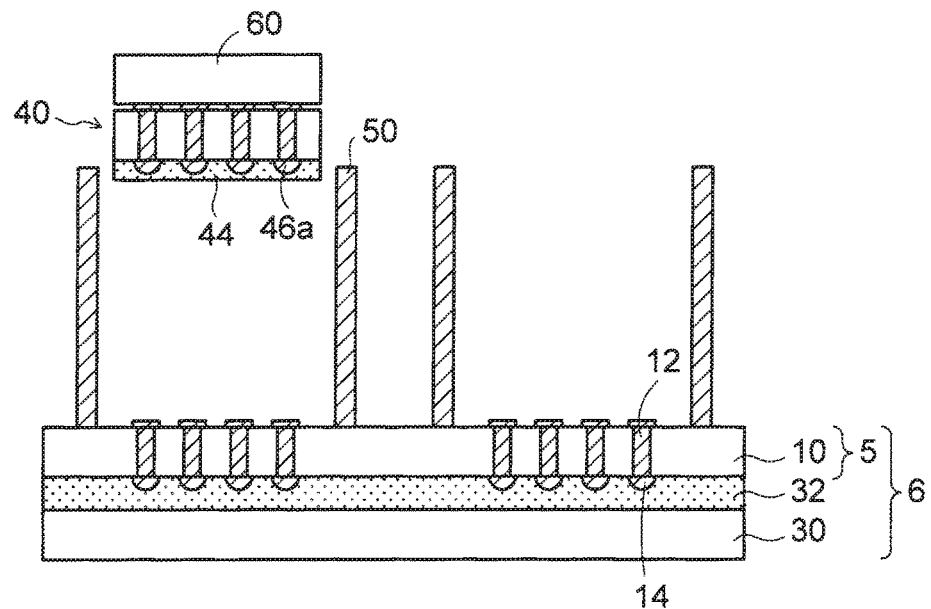
FIG. 18 is a sectional view (Part 11) showing the manufacturing method for the semiconductor device according to the embodiment.
Figure 19:
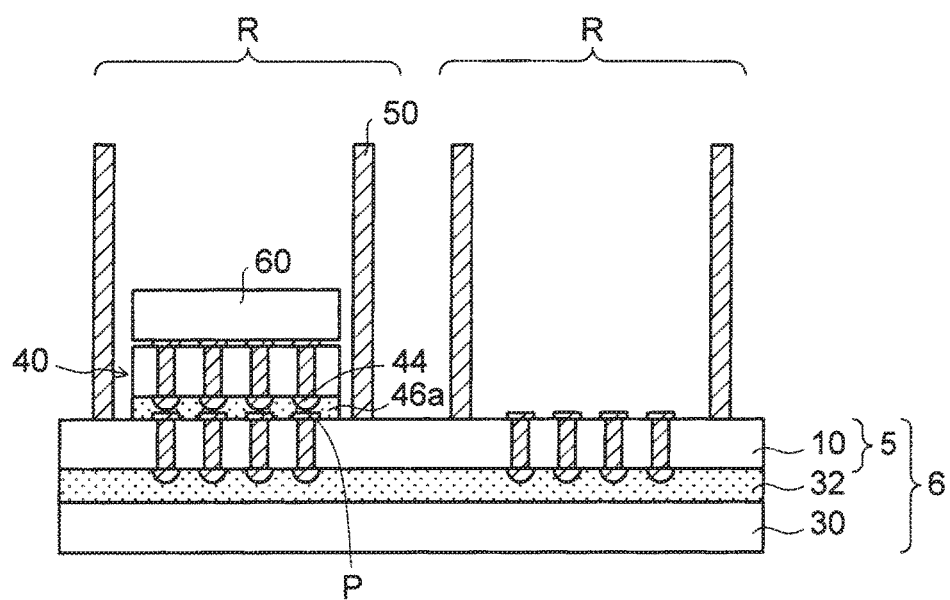
FIG. 19 is a sectional view (Part 12) showing the manufacturing method for the semiconductor device according to the embodiment.

As shown in FIG. 18, a bonding tool 60 for chip mounting is prepared, and a back surface of the memory chip 40 is adsorbed on a lower surface of the bonding tool 60. As shown in FIG. 19, the memory chip 40 adsorbed by the bonding tool 60 is disposed in one chip region R of the semiconductor device wafer 5 of the semiconductor member 6 while being pressed with low pressure.

On this occasion, the memory chip 40 is simultaneously heated at a low temperature of 50° C. to 60° C. by a heating unit of the bonding tool 60.

Thus, the resin layer 46a of the memory chip 40 is softened and the memory chip 40 is temporarily bonded onto the semiconductor device wafer 5 by the resin layer 46a. The connection terminals 44 of the memory chip 40 are disposed correspondingly on the electrode pads P of the semiconductor device wafer 5.

On this occasion, the memory chip 40 is disposed with the low pressure. Accordingly, the resin layer 46a is interposed between the connection terminals 44 of the memory chip 40 and the electrode pads P of the semiconductor device wafer 5.

As will be described later, after the multilayer chip stacks are temporarily bonded in the chip regions R of the semiconductor device wafer 5 respectively, the multilayer chip stacks are reflow-soldered collectively and simultaneously. Therefore, in this stage, the connection terminals 44 of the memory chip 40 do not have to be brought into contact with the electrode pads P of the semiconductor device wafer 5.

In this step, the resin layer 46a of the memory chip 40 is merely temporarily bonded to the semiconductor device wafer 5. Accordingly, a mounting time of one memory chip 40 can be shortened to about half of the time in the case where the same memory chip 40 is reflow-soldered.

When, for example, a mounting time for reflow-soldering the memory chip in FIG. 1C according to the aforementioned preliminary matter is about 40 seconds, the mounting time for temporarily bonding the memory chip 40 in FIG. 19 can be shortened to about 20 seconds.

Figure 20:
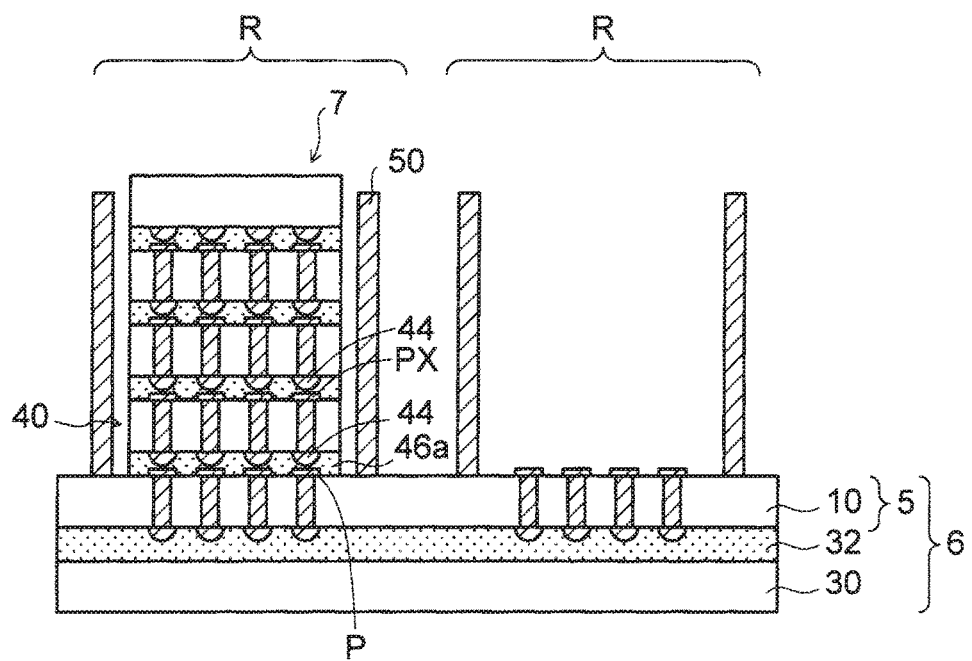
FIG. 20 is a sectional view (Part 13) showing the manufacturing method for the semiconductor device according to the embodiment.

Next, as shown in FIG. 20, the bonding tool 60 is used to layer four memory chips 40 on top of one another in one chip region R of the semiconductor device wafer 5 by the same mounting method to thereby obtain a multilayer chip stack 7.

Connection terminals 44 of the memory chips 40 assigned for second to fourth layers are disposed in positions corresponding to the electrodes pads PX of the back surface of the memory chip 40 disposed under the memory chips 40 assigned for the second to fourth layers.

In addition, the uppermost memory chip 40 assigned for the fourth layer is not provided with any through electrode and any electrode pad but provided with the connection terminals 44 on a lower surface side of the uppermost memory chip 40.

Figure 21A:
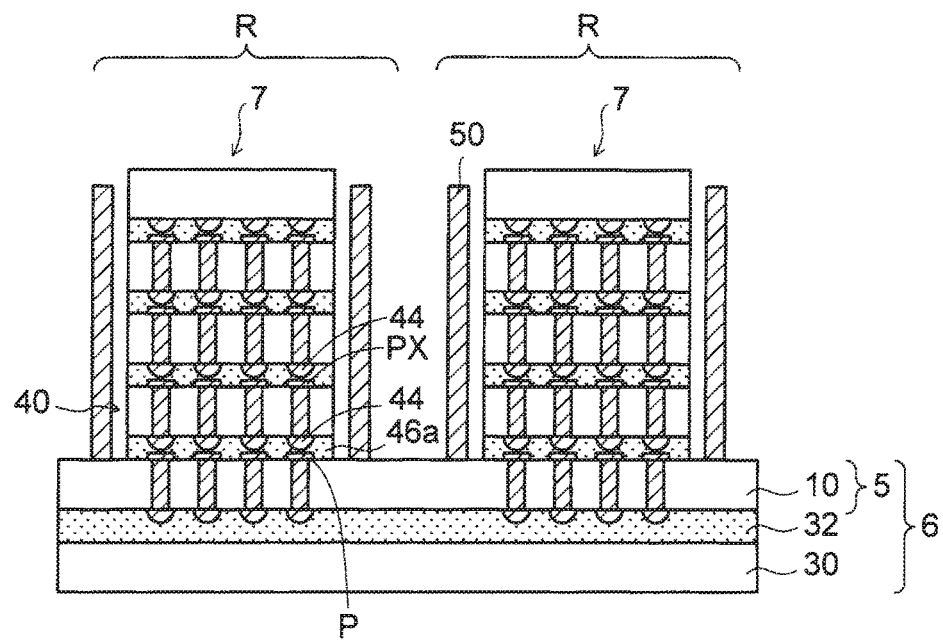
FIGS. 21A and 21B are a sectional view and a plan view (Part 14) showing the manufacturing method for the semiconductor device according to the embodiment.

Further, as shown in FIG. 21A, four memory chips 40 are mounted in another chip region R of the semiconductor device wafer 5 to thereby obtain another multilayer chip stack 7.

When such mounting of a memory chip 40 by the bonding tool 60 is repeated, the multilayer chip stacks 7 are sequentially formed in all the chip regions R of the semiconductor device wafer 5 in the plan view of the aforementioned FIG. 13B.

Figure 21B:
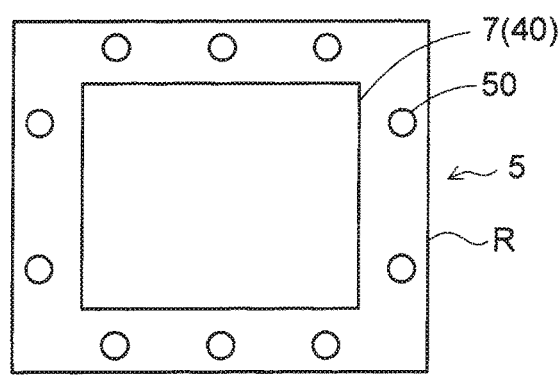

When one of the chip regions R of the semiconductor device wafer 5 in FIG. 21A is viewed, as shown in a plan view of FIG. 21B, the multilayer chip stack 7 is surrounded by the columnar space's 50.

As described above, the mounting time for temporarily bonding the memory chip 40 can be shortened to about half of the time for reflow-soldering the memory chip 40. In FIG. 21A, a large number of the memory chips 40 are mounted one by one. Accordingly, a total mounting time can be shortened more greatly than a mounting time according to the preliminary matter. Thus, production efficiency can be improved.

Figure 22:
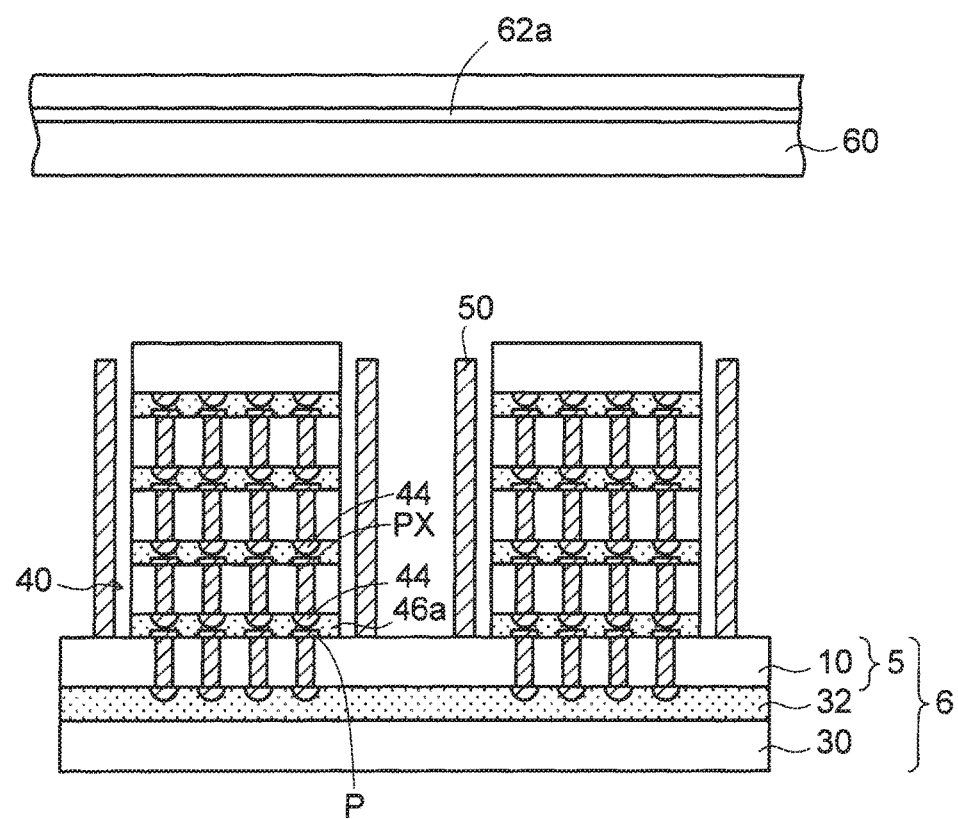
FIG. 22 is a sectional view (Part 15) showing the manufacturing method for the semiconductor device according to the embodiment.

Next, as shown in FIG. 22, a heating tool 62 is prepared. The heating tool 62 has a heating unit 62a such as a pulse heater which can heat a work rapidly. In addition, a pressing mechanism (not shown) for pressing the work downward is attached to the heating tool 62.

Figure 23A:
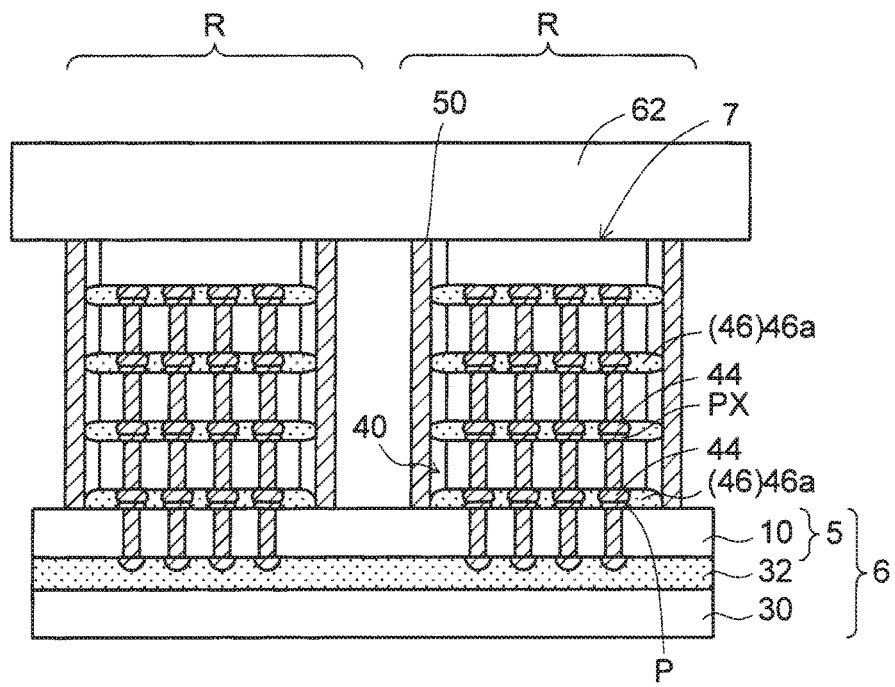
FIGS. 23A and 23B are a sectional view and a plan view (Part 16) showing the manufacturing method for the semiconductor device according to the embodiment.

As shown in FIG. 23A, the multilayer chip stacks 7 which are arranged side by side on the semiconductor device wafer 5 are heated while collectively pressed downward by the heating tool 62. On this occasion, a lower surface of the heating tool 62 abuts against upper ends of the columnar spacers 50. Thus, the columnar spacers 50 serve as stoppers of the heating tool 62.

Thus, desired pressing force can be applied uniformly to the multilayer chip stacks 7 in the respective chip regions R in the semiconductor device wafer 5. In order to apply the desired pressing force to the multilayer chip stacks 7, the height of each of the columnar spacers 50 is adjusted to be lower than the height of each of the multilayer chip stacks 7 in a stage (FIGS. 21A and 21B) where the heating tool 62 has not pressed the multilayer chip stacks 7 yet.

When the multiplayer chip stacks 7 are pressed by the heating tool 62 in a state where the columnar spacers 50 are absent differently from the embodiment, the pressing force varies in the semiconductor device wafer 5. Accordingly, connection quality varies from one chip region R to another to thereby cause deterioration of a manufacturing yield.

In this manner, in all the chip regions R in the semiconductor device wafer 5, the connection terminals 44 of the memory chips 40 pierce the resin layers 46a to abut against the electrode pads P of the semiconductor device wafer 5 with moderate pressure. In addition, in the same manner, the connection terminals 44 of each upper memory chip 40 abut against the electrode pads PX of each lower memory chip 40 with moderate pressure.

In this state, the entire semiconductor device wafer 5 is heated collectively and simultaneously by the heating tool 62. Thus, the solders 44c (FIG. 17B) at front ends of the connection terminals 44 of the memory chips 40 in all the chip regions R in the semiconductor device wafer 5 are reliably bonded to the electrode pads P of the semiconductor device wafer 5.

In addition, the solders 44c (FIG. 17B) at the front ends of the connection terminals 44 of the upper memory chip 40 are reliably bonded to the electrode pads PX of the lower memory chip 40 in the same manner.

In addition, at the same time, the uncured resin layer 46a in the lower surface of each of the memory chips 40 flows laterally by the pressing force of the heating tool 62. In this state, the uncured resin layer 46a is cured by the heat applied to the memory chip 40. Thus, the resin layer 46a becomes an underfill resin 46.

In this manner, a gap between each of the lowermost memory chips 40 and the semiconductor device wafer 5 and a gap between adjacent ones of the memory chips 40 of each of the multilayer chip stacks 7 are filled with the underfill resins 46 respectively.

In the case where, for example, lead-free solders such as tin (Sn)-silver (Ag)-copper (Cu) solders are used, heating is performed at a reflow temperature of 230° C. to 260° C. for a processing time of 10 seconds.

The heating is performed simultaneously on the multilayer chip stacks 7 for the processing time of about 10 seconds. The multilayer chip stacks 7 are disposed on the large number of the chip regions R in the semiconductor device wafer 5. Therefore, the processing time for the heating does not affect deterioration of production efficiency.

In the embodiment, the total processing time for mounting the multilayer chip stacks 7 in all the chip regions R in the semiconductor device wafer 5 is equal to the sum of the processing times for the temporary bonding in FIG. 19 (20 seconds×the number of the memory chips to be mounted) and the processing time (10 seconds) for the heating in FIG. 23A.

On the other hand, the total mounting time for mounting the multilayer chip sticks according to the aforementioned preliminary matter is equal to the sum of the processing times (40 seconds×the number of the memory chips to be mounted) for the reflow soldering in FIG. 1C.

Thus, by use of the mounting method for the memory chip 40 according to the embodiment, the total processing time for reflow-soldering the memory chips 40 can be shortened greatly. Accordingly, production efficiency can be improved.

Figure 23B:
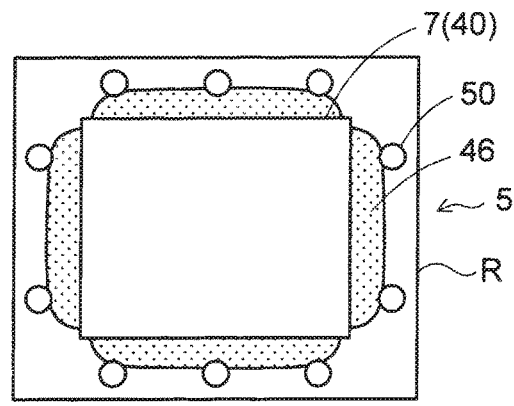

On this occasion, refer to a partial enlarged plan view of FIG. 23B additionally. The uncured resin layers 46a in the lower surfaces of the memory chips 40 are pressed by the heating tool 62 to flow laterally. In this state, the uncured resin layers 46a are cured. Therefore, outer edge portions of the underfill resins 46 can be brought into contact with the columnar spacers 50.

Thus, heat generated from the memory chips 40 etc. can be radiated to the outside through the underfill resins 46 and the columnar spacers 50. Since the underfill resins 46 are connected to the columnar spacers 50 in this manner, the columnar spacers 50 can be used as heat radiators.

As described above, the columnar spacers. 50 are disposed around the multilayer chip stacks 7. Thus, heat radiation paths can be secured.

On the other hand, in this stage, hollows are formed between the respective side surfaces of the four layered memory chips 40 and the columnar spacers SU.

For example, the height of each of the connection terminals 44 of the memory chips 40 (across a gap between adjacent ones of the memory chips 40) is set at 20 µm and the thickness of each of the resin layers 46a is set at 40 µm to 50 µm. In this case, an interval between each of the side surfaces of the multilayer chip stacks 7 and the corresponding columnar spacers 50 is set at about 200 µm.

With the positional relation set in such a manner, the outer edge portions of the underfill resins 46 can be brought into contact with the columnar spacers 50 stably when the underfill resins 46 are formed from the resin layers 46a in the lower surfaces of the memory chips 40.

Each of the resin layers 46a becomes the underfill resin 46 while substantially not flowing from the four corners of the rectangular memory chip 40 but flowing outward from the four sides of the memory chip 40:

Thus, even when the columnar spacers 50 are disposed to be opposed to the four corners of the rectangular memory chips 40, the underfill resins 46 cannot make contact with the columnar spacers 50. Accordingly, the columnar spacers 50 are disposed not to be opposed to the four corners of the memory chips 40 (i.e. the multilayer chip stack 7) outside the four corners.

Figure 24:
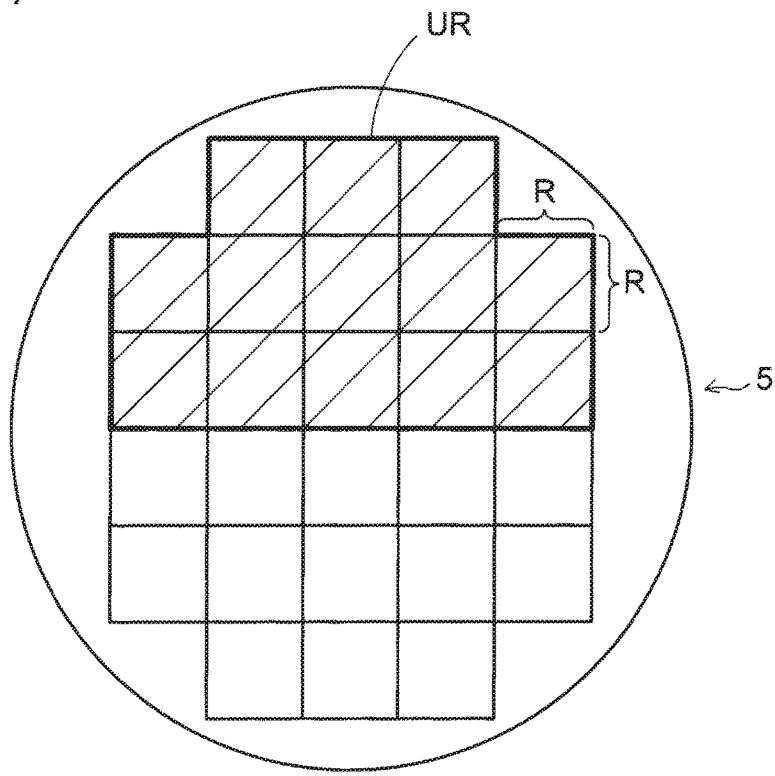
FIG. 24 is a plan view (Part 17) showing the manufacturing method for the semiconductor device according to the embodiment.

An entire state of the semiconductor device wafer 5 in FIG. 23A is shown in FIG. 24. In FIG. 24, only the chip regions R defined in the semiconductor device wafer 5 are illustrated, but the multilayer chip stacks 7 or the columnar spacers 50 in the chip regions R are omitted.

In the aforementioned step of FIG. 23A, as described above, the heating tool 62 equal to or larger than the semiconductor device wafer 5 in planar size may be used so that the multilayer chip stacks 7 in all the chip regions R of the semiconductor device wafer 5 in FIG. 24 can be heated collectively and simultaneously.

Alternatively, a heating tool 62 smaller than the semiconductor device wafer 5 in planar size may be used so that unit regions UR defined by division of the semiconductor device wafer 5 and each having a desired number of chip regions R can be heated one by one by the heating tool 62.

For example, in the example of FIG. 24, all the chip regions R of the semiconductor device wafer 5 are divided and sectioned into two unit regions. Only one unit region UR including chip regions R surrounded by a thick line is heated first by the heating tool 62. Then, the other unit region is heated by the heating tool 62.

When the multilayer chip stacks 7 in a large number of chip regions R are pressed simultaneously by the heating tool 62, the pressing force applied to the individual multilayer chip stacks 7 is dispersed. For this reason, there may be a case where the multilayer chip stacks 7 cannot be pressed with desired pressure in some specification of the heating tool 62.

Therefore, particularly when a large-diameter semiconductor device wafer 5 is used and it is necessary to apply large pressing force to the semiconductor device wafer 5, the semiconductor device wafer 5 may be divided and sectioned into unit regions UR and the unit regions UR may be heated one by one.

Figure 25:
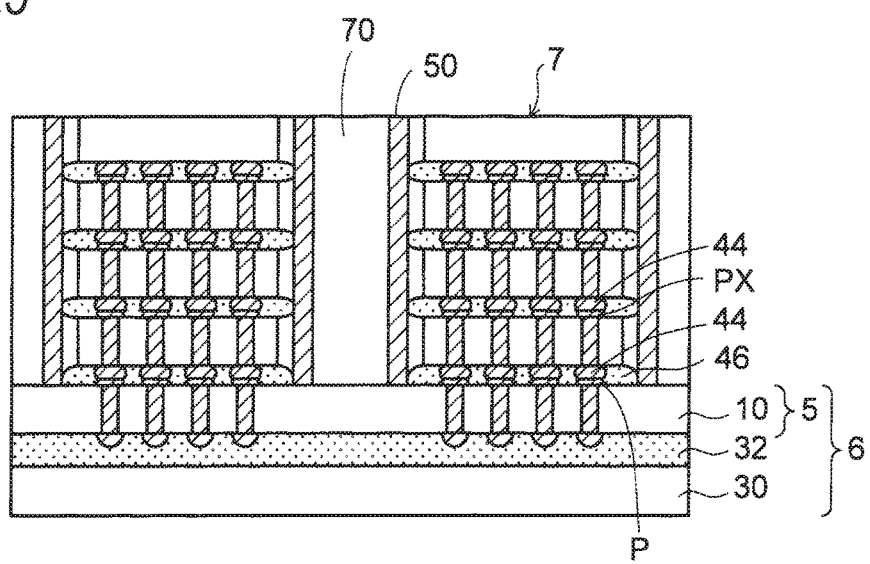
FIG. 25 is a sectional view (Part 18) showing the manufacturing method for the semiconductor device according to the embodiment.

Next, the heating tool 62 is removed from a structure body of FIG. 23A, as shown in FIG. 25. Further, side regions of the multilayer chip stack 7 disposed in each of the chip regions R of the semiconductor device wafer 5 and outer circumferential surfaces of the columnar spacers 50 are sealed with a mold resin 70. The mold resin 70 is formed so that the upper end surfaces of the columnar spacers 50 and the back surfaces of the uppermost memory chips 40 can be exposed from the mold resin 70.

When the mold resin 70 is also formed on the columnar spacers 50 and the uppermost memory chips 40, the mold resin 70 is removed by polishing etc. to expose the upper end surfaces of the columnar spacers 50 and the back surfaces of the uppermost memory chips 40. Heat can be radiated easily due to the structure in which the upper end surfaces of the columnar spacers 50 and the hack surfaces of the uppermost memory chips 40 are exposed.

Figure 26:
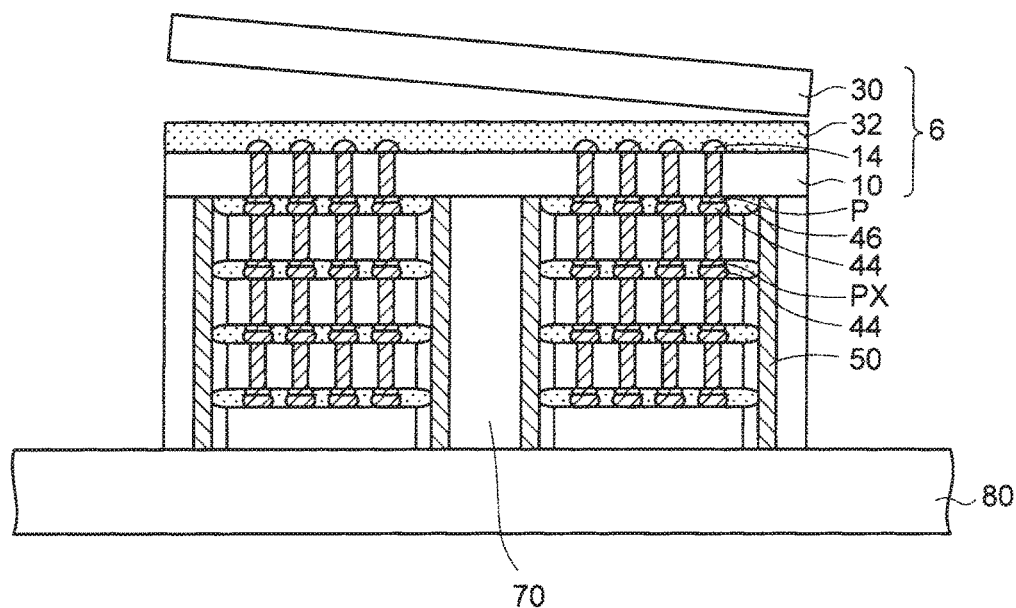
FIG. 26 is a sectional view (Part 19) showing the manufacturing method for the semiconductor device according to the embodiment.

Successively, as shown in FIG. 26, a structure body of FIG. 25 is inverted vertically so that the back surfaces of the memory chips 40 of the multilayer chip stacks 7 can be disposed on a dicing tape 80. The support member 30 of the semiconductor member 6 is separated from the adhesive layer 32.

Figure 27:
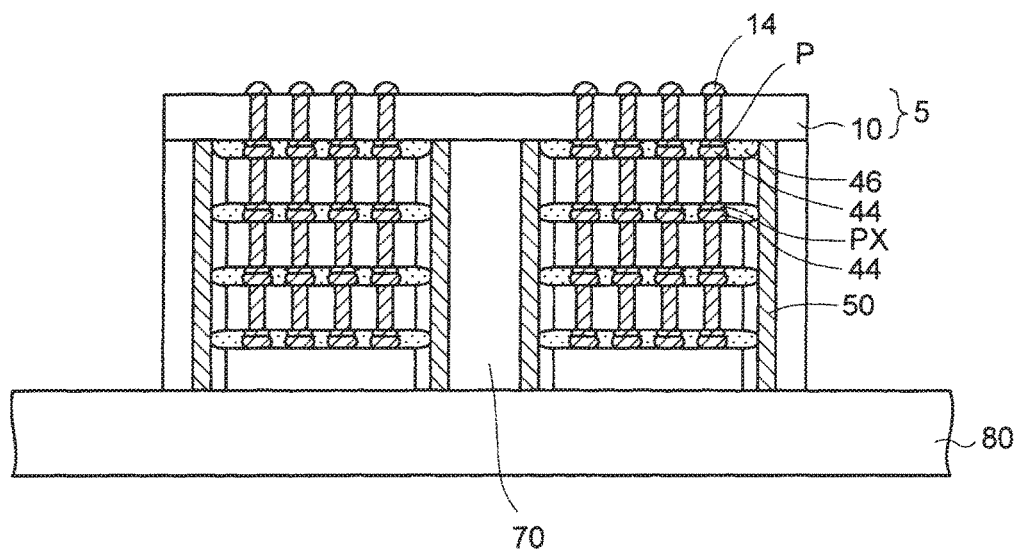
FIG. 27 is a sectional view (Part 20) showing the manufacturing method for the semiconductor device according to the embodiment.

Further, as shown in FIG. 27, the adhesive layer 32 is separated from the semiconductor device wafer 5. Thus, the connection terminals 14 of the semiconductor device wafer 5 are exposed.

When an adhesive tape whose bonding force can be weakened by ultraviolet (UV) radiation is used as the adhesive layer 32, ultraviolet rays (UV) are radiated onto the adhesive layer 32 through the support member 30 before the support member 30 is separated in the aforementioned step of FIG. 26. In this case, a transparent glass substrate is used as the support member 30.

Thus, the bonding force of the adhesive layer 32 is weakened so that the support member 30 and the adhesive layer 32 can be separated easily.

When a general adhesive film is used as the adhesive layer 32, a mold release agent may be formed in a separation interface so that the support member 30 and the adhesive layer 32 can be physically separated easily.

Figure 28:
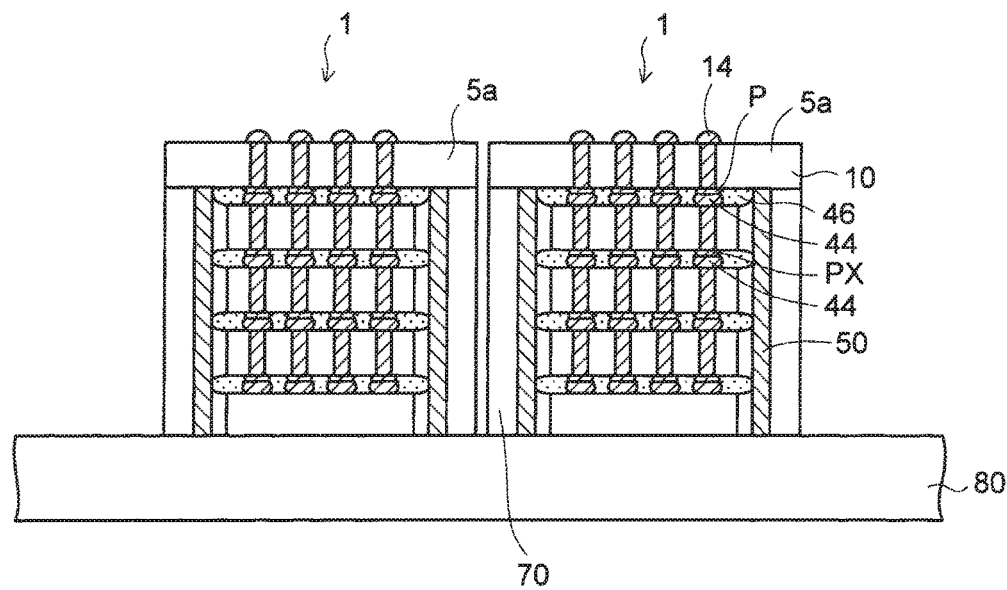
FIG. 28 is a sectional view (Part 21) showing the manufacturing method for the semiconductor device according to the embodiment.

Next, as shown in FIG. 28, of a structure body of FIG. 27, a part extending from the upper surface of the semiconductor device wafer 5 to a lower surface of the mold resin 70 is cut so that the chip regions R of the semiconductor device wafer 5 in the aforementioned FIG. 24 can be obtained, as shown in FIG. 28. Thus, the semiconductor device wafer 5 is separated into individual semiconductor chips● 5a. Thus, individual semiconductor devices 1 can be obtained.

Then, each of the semiconductor devices 1 in FIG. 28 is removed from the dicing tape 80 and inverted vertically, as shown in FIG. 29. Thus, the semiconductor device 1 according to the embodiment can be obtained.

As shown in FIG. 29, the semiconductor device 1 according to the embodiment is provided with the semiconductor chip 5a in its lowermost portion. The semiconductor chip 5a is, for example, a control device controlling a memory chip. The semiconductor chip 5a can be obtained in each of the chip regions R separated individually by the division of the semiconductor device wafer 5 in the aforementioned FIGS. 13A and 13B. The semiconductor chip 5a is an example of a first semiconductor chip. Various LSI chips can be used as the semiconductor chip 5a.

The semiconductor chip 5a is provided with through electrodes 12 which penetrate the semiconductor chip 5a in a thickness direction thereof. Electrode pads P are connected to upper surfaces of the through electrodes 12. Connection terminals 14 are connected to lower surfaces of the through electrodes 12. The remaining detailed structure of the semiconductor chip 5a is the same as that in the aforementioned FIG. 121).

The semiconductor chip 5a is provided with the electrode pads P on its one surface (back surface in the example of FIG. 29).

Connection terminals 44 of a first memory chip 40a are flip-chip connected to the electrode pads P disposed on a central portion of the back surface of the semiconductor chip 5a. The first memory chip 40a is provided with through electrodes TE which penetrate the first memory chip 40a in a thickness direction thereof. The connection terminals 44 are connected to lower surfaces of the through electrodes TE. Electrode pads PX are connected to upper surfaces of the through electrodes TE. A gap between the semiconductor chip 5a and the first memory chip 40a is filled with an underfill resin 46.

In addition, connection terminals 44 of a second memory chip 40b are flip-chip connected to the electrode pads PX on a back surface of the first memory chip 40a. A gap between the first memory chip 40a and the second memory chip 40b is filled with an underfill resin 46.

Further, connection terminals 44 of a third memory chip 40c are flip-chip connected to electrode pads PX on a back surface of the second memory chip 40b. A gap between the second memory chip 40b and the third memory chip 40c is filled with an underfill resin 46.

The second, third memory chip 40b, 40c has the same structure as the first memory chip 40a.

In addition, connection terminals 44 of a fourth memory chip 40d are flip-chip connected to electrode pads PX on a back surface of the third memory chip 40c. A gap between the third memory chip 40c and the fourth memory chip 40d is filled with an underfill resin 46.

The underfill resins 46 are filled to cover the connection terminals 44 of the first to fourth memory chips 40a to 40d.

The uppermost fourth memory chip 40d is not provided with any through electrode and any electrode pad but provided with the connection terminals 44 in a lower surface of the fourth memory chip 40d.

Each of the first to fourth memory chips 40a to 40d is an example of a second semiconductor chip.

Thus, the connection terminals 44 of the first memory chip 40a are connected to the electrode pads P of the semiconductor chip 5a. The first to fourth memory chips 40a to 40d are layered on top of one another through the connection terminals 44. As a result, a multilayer chip stack 7 is formed.

In this manner, the multilayer chip stack 7 connected to the electrode pads P of the semiconductor chip 5a is disposed on the one surface (back surface) of the semiconductor chip 5a.

In addition, in the multilayer chip stack 7, the first to fourth memory chips 40a to 40d are layered on top of one another through the connection terminals 44, and the first memory chip 40a in the lowermost layer is connected to the electrode pads of the semiconductor chip 5a through the connection terminals 44.

In addition, the columnar spacers 50 are disposed out of the region where the multilayer chip stack 7 on the one surface (back surface) of the semiconductor chip 5a is disposed.

Refer to a plan view of FIG. 30 additionally. The columnar spacers 50 are divided, arranged and disposed in circumferential edge portions of the semiconductor chip 5a so as to surround the multilayer chip stack 7 disposed in the central portion of the semiconductor chip 5a.

Outer edge portions of the underfill resins 46 with which the gaps among the first to fourth memory chips 40a to 40d are filled make contact with outer surfaces of the columnar spacers 50. In addition, in the same manner, the outer edge portions of the underfill resin 46 with which the gap between the semiconductor chip 5a and the first memory chip 40a is filled make contact with the outer surfaces of the columnar spacers 50.

In addition, the side surfaces of the multilayer chip stack 7 and the columnar spacers 50 are sealed with the mold resin 70. A gap between each of the side surfaces of the first to fourth memory chips 40a to 40d and the corresponding columnar spacers 50 is also filled with the mold resin 70.

The back surface of the uppermost fourth memory chip 40d of the multilayer chip stack 7 and the upper end surfaces of the columnar spacers 50 are exposed from the mold resin 70.

Thus, the mold resin 70 covering the multilayer chip stack 7 and the columnar spacers 50 is provided on the one surface (back surface) of the semiconductor chip 5a. The upper surface of the multilayer chip stack 7 and the upper surfaces of the columnar spacers 50 are exposed from the mold resin 70.

Heat generated from the semiconductor chip 5a and the first to fourth memory chips 40a to 40d passes the underfill resins 46 charged into the gaps among the semiconductor chip 5a and the first to fourth memory chips 40a to 40d, and is radiated to the outside through the columnar spacers 50.

Thus, the columnar spacers 50 function as heat radiators. Accordingly, heat radiation can be obtained satisfactorily. The columnar spacers 50 are made of metal such as copper high in heat conductivity. When high heat radiation is not required, the columnar spacers 50 may be made of an insulating material such as a resin.

In addition, as have been described in the aforementioned manufacturing method, the columnar spacers 50 are used as stoppers for determining the height position of the heating tool in order to press the multilayer chip stacks 7 uniformly when the multilayer chip stacks 7 disposed on the chip regions R in the semiconductor device wafer 5 are heated.

Therefore, even when a large-diameter semiconductor device wafer 5 is used to manufacture the semiconductor devices 1 according to the embodiment, the semiconductor devices 1 can be manufactured with a good yield, and reliability in electric connection between adjacent ones of the layered chips can be improved.

In addition, as have been described in the aforementioned manufacturing method, the total processing time for forming the multilayer chip stacks 7 in the chip regions R in the semiconductor device wafer 5 can be shortened. Accordingly, the semiconductor devices 1 can be manufactured with good production efficiency and reduction in cost can be attained.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing a semiconductor device, comprising:

a) preparing a semiconductor device wafer comprising at least one chip region where a first semiconductor chip is to be formed, wherein the chip region comprises an electrode pad;

b) preparing a plurality of second semiconductor chips each of which comprises a connection terminal and a resin layer where the connection terminal is embedded;

c) providing a columnar spacer on the semiconductor device wafer except the chip region;

d) disposing a multilayer chip stack comprising the plurality of second semiconductor chips in the chip region on the semiconductor device wafer, wherein one of the second semiconductor chips is disposed on the semiconductor device wafer, and another one of the second semiconductor chips is disposed on the one of the second semiconductor chips; and e) heating the multilayer chip stack while pressing the multilayer chip stack by a heating tool using the columnar spacer as a stopper.

2) The method according to clause (1), wherein the resin layer contacts the columnar spacer in the step (e).

3) The method according to clause (1), wherein the columnar spacer is made of metal in the step (c).

4) The method according to clause (1), wherein
in the step (c), the columnar spacer comprises a plurality of columnar spacers, and the plurality of columnar spacers are disposed to surround the chip region.

5) The method according to clause (4), wherein
the multilayer chip stack is formed into a rectangular shape in plan view, and
the plurality of columnar spacers are not opposed to four corners of the multilayer chip stack.

6) The method according to clause (1), wherein
each of the second semiconductor chips comprises:
a through electrode;
an electrode pad that is connected to an upper surface of the through electrode; and
the connection terminal that is connected to a lower surface of the through electrode, and
in the step (d), the connection terminal of the other one of the second semiconductor chips is connected to the electrode pad of the one of the second semiconductor chips.

7) The method according to clause (1), wherein
the chip region comprises a plurality of chip regions;
the semiconductor device wafer is sectioned into a plurality of unit regions;
each of the unit regions has at last one chip region; and
the step (e) is performed for each of the unit regions.

What is claimed is:

1. A semiconductor device comprising:
a first semiconductor chip comprising an electrode pad on one surface of the first semiconductor chip;
a multilayer chip stack that is disposed on the one surface of the first semiconductor chip to be connected to the electrode pad;
a plurality of columnar spacers disposed on the one surface of the first semiconductor chip, the plurality of columnar spacers surrounding the multilayer chip stack and disposed outside the outer periphery of the multilayer chip stack; and
an underfill resin,
wherein:
the multilayer chip stack comprises a plurality of second semiconductor chips each of which comprises a connection terminal;
the connection terminal of one of the second semiconductor chips is directly connected to the electrode pad;
another one of the second semiconductor chips is mounted on the one of the second semiconductor chips;
a gap between the first semiconductor chip and the one of the second semiconductor chips and a gap between adjacent ones of the second semiconductor chips are filled with the underfill resin; and
a height of each of the plurality of columnar spacers is greater than a height of the connection terminal of each of the plurality of second semiconductor chips.

2. The semiconductor device according to claim 1, wherein the underfill resin contacts the columnar spacer.

3. The semiconductor device according to claim 1, wherein the columnar spacer is made of metal.

4. The semiconductor device according to claim 1, wherein
the multilayer chip stack is formed into a rectangular shape in plan view, and
the plurality of columnar spacers are not opposed to four corners of the multilayer chip stack.

5. The semiconductor device according to claim 1, wherein
each of the second semiconductor chips comprises:
a through electrode;
an electrode pad that is connected to an upper surface of the through electrode; and
the connection terminal that is connected to a lower surface of the through electrode, and
the connection terminal of the other one of the second semiconductor chips is connected to the electrode pad of the one of the second semiconductor chips.

6. The semiconductor device according to claim 1, further comprising:
a mold resin that is formed on the one surface of the first semiconductor chip to cover the multilayer chip stack and the columnar spacer; wherein
an upper surface of the multilayer chip stack and an upper surface of the columnar spacer are exposed from the mold resin.

* * * * *